US006813305B2

(12) United States Patent
Clayton et al.

(10) Patent No.: US 6,813,305 B2
(45) Date of Patent: Nov. 2, 2004

(54) METHOD AND APPARATUS FOR OPTICAL WAVELENGTH CONVERSION

(75) Inventors: Richard D. Clayton, Kanata (CA); Stephen Clements, Stansted (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/191,488

(22) Filed: Jul. 10, 2002

(65) Prior Publication Data

US 2003/0039024 A1 Feb. 27, 2003

Related U.S. Application Data

(60) Provisional application No. 60/304,083, filed on Jul. 11, 2001.

(51) Int. Cl.[7] .................................................. H01S 5/00
(52) U.S. Cl. .......................................... 372/96; 372/50
(58) Field of Search ............................ 372/96, 71, 72, 372/73, 29.01, 26, 6, 101, 102, 20, 23, 54, 18, 19, 25; 359/337.11; 385/15

(56) References Cited

U.S. PATENT DOCUMENTS 5,212,745 A * 5/1993 Miller .......................... 385/25
5,563,973 A * 10/1996 Miller et al. .................. 385/81
5,751,758 A * 5/1998 Kuwatsuka .................. 372/96
5,754,714 A * 5/1998 Suzuki et al. .................. 385/5
5,946,438 A * 8/1999 Minot et al. .................. 385/88
5,949,801 A * 9/1999 Tayebati ...................... 372/20
6,263,002 B1 * 7/2001 Hsu et al. ...................... 372/6
6,366,592 B1 * 4/2002 Flanders ...................... 372/18
6,438,304 B1 * 8/2002 Lawrence et al. .......... 385/123
2002/0176457 A1 * 11/2002 DeCusatis et al. ............ 372/26
2002/0181833 A1 * 12/2002 Berger ........................ 385/15
2003/0002141 A1 * 1/2003 DeCusatis et al. ..... 359/337.11

* cited by examiner

Primary Examiner—Don Wong
Assistant Examiner—Tuan N. Nguyen

(57) ABSTRACT

A method of wavelength conversion includes receiving a modulated optical signal of a first wavelength and using the modulated optical signal to optically pump an active medium to generate and transmit a like modulated optical signal of a second wavelength, all of which is affected entirely within an optical domain without electrical contacts. Also, an optical wavelength converter includes an active medium that is optically pumped by a modulated optical signal of a first wavelength and transmits the modulated optical signal at a second wavelength. The active medium may be contained in a detachable, external module for wavelength conversion of a fixed wavelength source.

20 Claims, 5 Drawing Sheets

METHOD AND APPARATUS FOR OPTICAL WAVELENGTH CONVERSION

BACKGROUND OF THE INVENTION

In optical networks, data from a source may be converted into an optical signal for transmission along an optical fibre. Complex optical transmission devices incorporating lasers for data transmission have been designed and packaged in single units, or modules. However, the signal wavelength outputted from these devices is predetermined by the lasing wavelength of the laser used in the device to generate the optical signal.

Often, it would be desirable to be able to set the output wavelength of the module during installation, and to be able to change it as required, whether for the purpose of colour choice, for compatibility with another optical device or system, or for other purposes.

One previous method was to manufacture a number of different fixed wavelength sourced optical transmission devices. Using the same device design, a variety of units are fabricated, each outfitted with lasers of varying wavelengths This results in expenditures associated with maintaining large inventories of multiple versions of the same device, not all of which may be used, and which may require complex processes to change the output wavelength of an installed source.

Another previous method was the tunable laser. For example, U.S. Pat. No. 5,949,801, issued Sep. 7, 1999 to Tayebati for Tunable Laser and Method for Operating the Same, discloses a tunable Fabry-Perot laser having a tunable Fabry-Perot filter as a wavelength-selective component. The application of a voltage to the filter changes its wavelength-selection properties. However, added complexity in the design and fabrication of tunable lasers increases the costs of such lasers, and hence, the costs associated with the device incorporating a tunable laser. Further, it is difficult to manufacture tunable lasers that are tunable, directly modulated and high speed.

A third method utilizes an attachable component incorporating fibre gratings, or other such component, of a period selected for a particular emitted frequency, that feed back an optical emission into a device with gain and a single mirror to form the oscillator cavity. For example, U.S. Pat. No. 5,978,400, issued Nov. 2, 1999 to Campbell et al., for Laser, discloses a laser diode coupled to an optical fibre having a grating. The laser characteristics depend on the optical phase relationship of the Bragg gratings in the external waveguide. While reducing the complexity incorporated into the optical transmission device, phase shift induced noise is increased as a result of the use of the attachable component. Also, the length of the laser cavity in such a configuration tends to be long where the spectral mode spacing is short. As a result, the likelihood of mode-hopping is increased.

BRIEF SUMMARY OF THE INVENTION

The present invention seeks to provide a method of generating a modulated optical signal and an optical wavelength converter module, which minimizes the above problems.

According to one aspect of the invention, there is provided a method of optical wavelength conversion including the steps of receiving a modulated optical signal of a first wavelength; stimulating an active medium using the modulated optical signal of the first wavelength for generating a like modulated optical signal of a second wavelength; and transmitting the modulated optical signal of the second wavelength; whereby wavelength conversion and modulation are affected entirely within an optical domain.

Also according to the invention, there is further provided an optical wavelength converter including a first part for receiving a modulated optical signal of a first wavelength; a part for stimulating an active medium using the modulated optical signal of the first wavelength for generating a like modulated optical signal of a second wavelength; and a second part for transmitting the modulated optical signal of the second wavelength; whereby wavelength conversion and modulation are affected entirely within an optical domain.

In one aspect of the invention, the first part, the active region, and the second part forms a resonator. The resonator may be of a vertical cavity surface emitting laser (VCSEL) type geometry, edge emitting geometry, optically pumped waveguide geometry, and the like.

In another aspect, the active region is contained in a module. The module is coupled to a source for generating a modulated optical signal of the first wavelength. The coupling is detachable and may be in the form of a detachable pigtail.

In yet another aspect of the invention, the optical signal transmitted by the second part is of a wavelength signal region suitable for optical communications, including amplified systems, wavelength division multiplexing (WDM) systems, and the like.

In yet a further aspect of the invention, the signal transmitted by the second part is along a same directional course as, or a different directional course than, the signal received by the first part, including at an angle to reduce back reflection of the signal received by the first part, in a direction perpendicular to the signal, or the like.

Advantageously, wavelength selection can be accomplished in a relatively simple and inexpensive fashion by providing the wavelength conversion of a fixed wavelength source comprising a simple resonator in an external module. By an optically pumped resonator with its own spectral and spatial filtering functions, and no electrical connections, there is no sensitivity to phase shift-induced noise resulting from use. Also, the configuration can result in oscillation in a mode best coupled to the optical fibre.

BRIEF DESCRIPTION OF THE DRAWINGS

Other aspects and features of the present invention will become apparent to those ordinarily skilled in the art upon review of the following description of specific embodiments of the invention in conjunction with the accompanying figures in which.

DETAILED DESCRIPTION OF THE INVENTION

Figure 1:
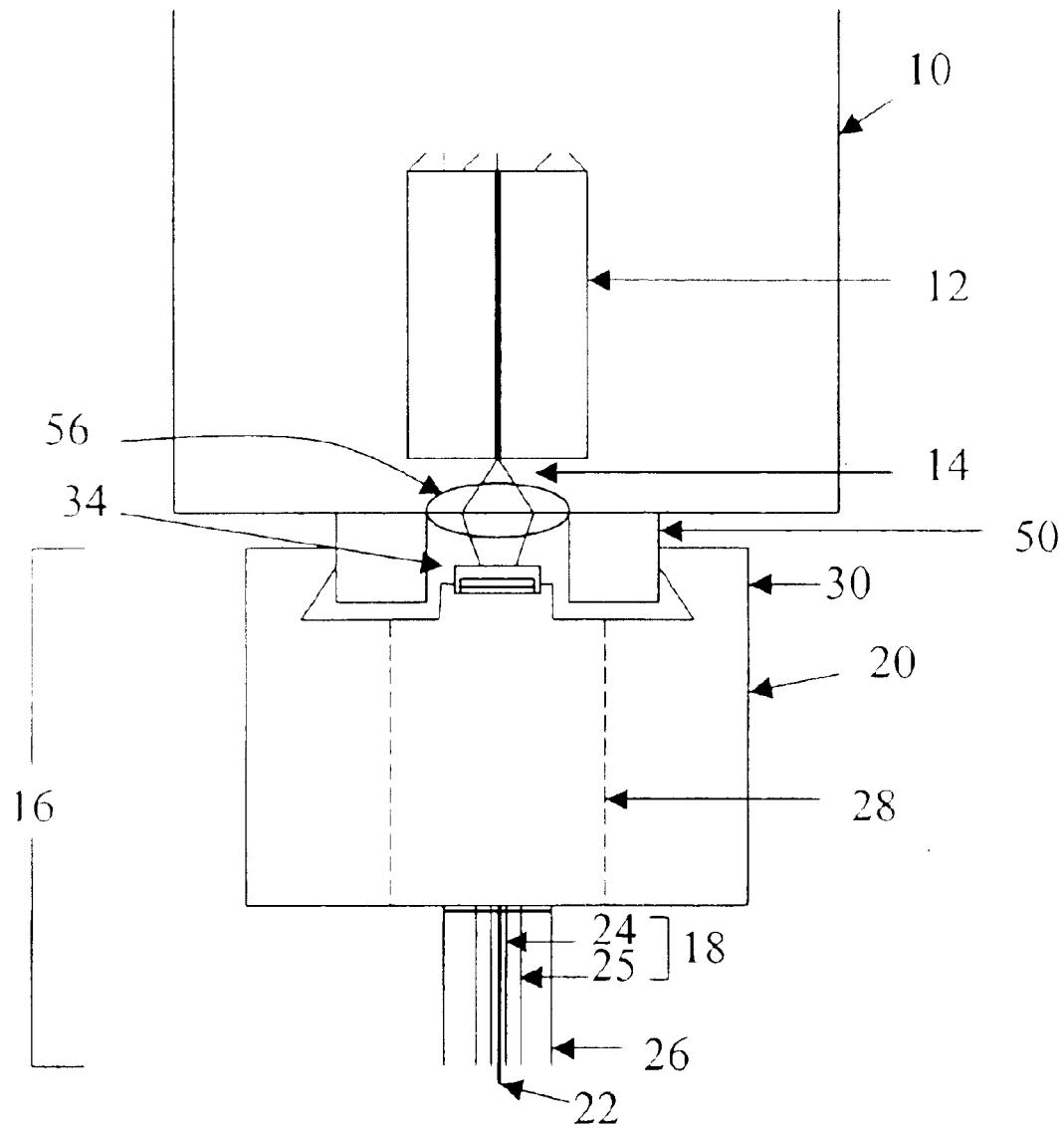
FIG. 1 is a top view of a wavelength converter module coupled to an optical transmission device, in accordance with an embodiment of the invention.
Figure 2:
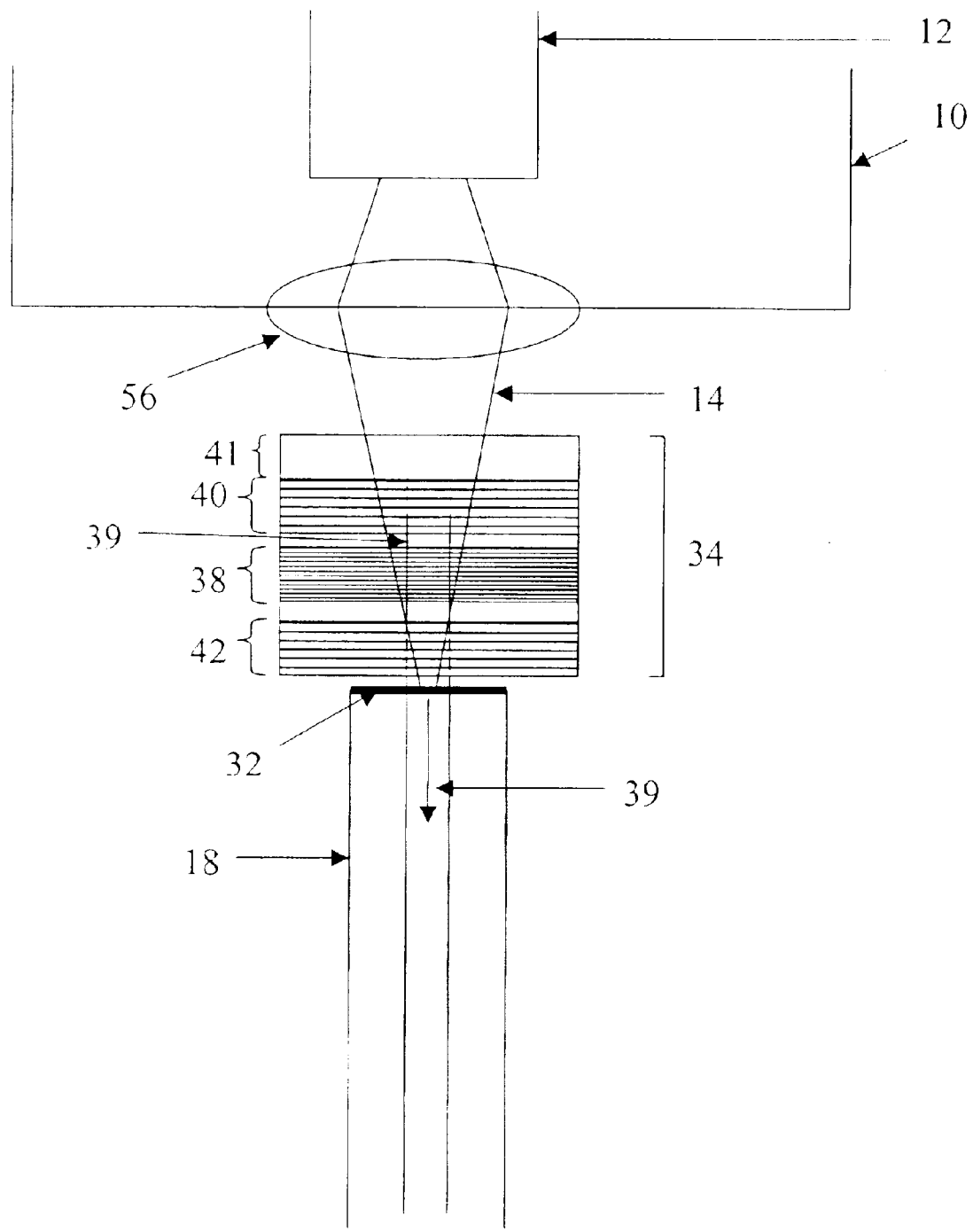
FIG. 2 is a close-up top view of the wavelength converter module of FIG. 1, with the connector parts removed.

Referring to FIGS. 1 and 2, an optical transmission device 10 optically coupled to a wavelength converter module 16 is shown.

The optical transmission device 10 is an optical source for digital data transmission in an optical transmission system, for example, a "gigabit interface converter (GBIC)" style module, a so-called "mini dual in line (mini-DIL)" module, or a conventional 14 pin "butterfly" module.

The optical transmission device 10 includes a directly modulated (DM) laser 12. The DM laser 12, for example, may be a semiconductor laser, including distributed feedback lasers (DFB lasers), distributed Bragg reflector (DBR) lasers, or Fabry-Perot semiconductor lasers in either edge emitting or surface emitting configurations.

The DM laser 12 produces a pump signal 14 of a spectral width suitable to optically pump a preselected laser resonator to be described below. Any pump wavelength in a range suitable for pumping a selected resonator may be used. Examples of wavelengths used in optical communication systems are around 850 nanometers, around 980 nanometers, around 1300 nanometers or around 1480 nanometers.

The pump signal 14, includes a time varying signal and conveys a data stream. A data signal is modulated into the carrier including, for example, by varying the intensity, frequency, polarisation, or phase of the carrier.

The pump signal 14 is coupled to and used to optically pump a laser resonator 34, producing an output signal 39. In the example of FIGS. 1 and 2, the resonator 34 is a semiconductor VCSEL type resonator. Preferably, the resonator 34 is a single frequency oscillator with gain, but it can be appreciated that the resonator need not have the VCSEL type geometry.

The VCSEL type resonator 34 of FIGS. 1 and 2 comprises an active region 38, of preselected gain or active material. The resonator 34 may be fabricated using a variety of materials including semiconductor compounds, polymers, organics or composites, or other materials capable of providing gain when optically pumped. For example, the resonator 34 may be semiconductor edge-emitters, such as a Fabry-Perot, DFB, or DBR, rare earth or semiconductor doped glass or polymer host, organic semiconductors, or other materials and geometries.

As will be appreciated, the active region 38 of the resonator 34 may be fabricated using conventional methodology and materials for producing signals at a selected wavelength. The fabrication methodology could also include the addition of layers whose purpose is to improve absorption of the pump signal 14 and transfer the carriers to the active layers of the active region 38.

As will be appreciated, the signal wavelength of the resonator 34 is selected possessing an acceptable spectral width and centre frequency accuracy for a particular application in an optical communications system. For example, the acceptable spectral width and accuracy of a signal in a dense wavelength division multiplexing (DWDM) network with a centre frequency of 50 Gigahertz channel separation is much less than 50 Gigahertz; typically only a few GHz. In a coarse wavelength division multiplexing (WDM) operating at 1310 nanometers with a channel separation of 10 to 20 nanometers, the acceptable width and accuracy of a signal may be a few nanometers.

Figure 3:
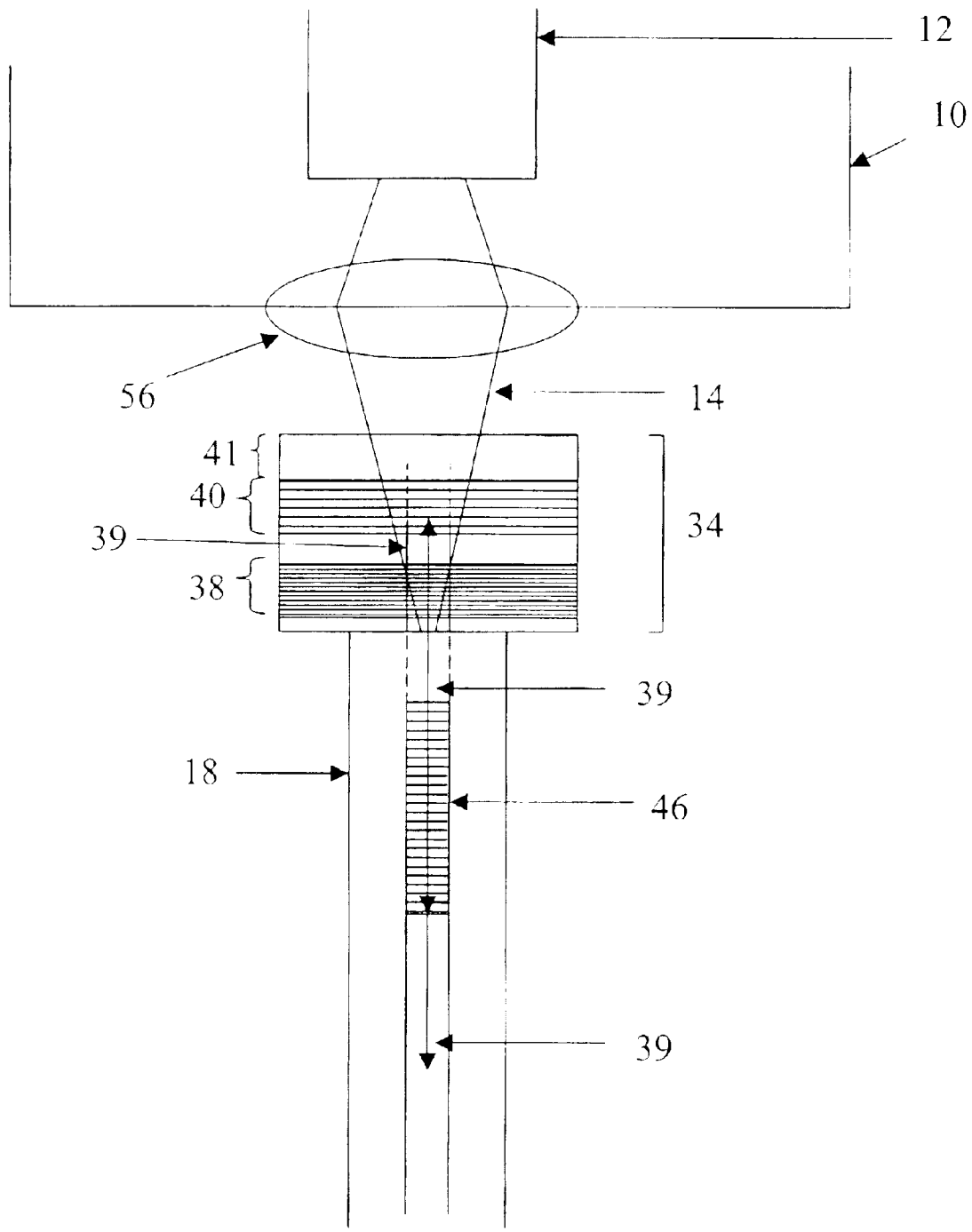
FIG. 3 is a close-up top view of the wavelength converter module with the connector parts removed, in accordance with an alternative embodiment of the invention.

Signal wavelength may be further selected outside of the active region 38 through the provision of physical structures such as gratings 46, as shown as an example in FIG. 3 and further described below, or interference filters.

The resonator 34 lacks electrical contacts and is not provided with electrical injection current. The removal of the electrical pumping constraint allows other materials, such as dielectrics, to be used advantageously. For example, an active region 38 may be clad by a suitable material, such as silicone, to compensate for temperature variation to make a source independent of temperature.

The feedback mechanism consists of the two reflectors on either side of the active material, which are aligned in a manner to reflect coherent light 39 back and forth through the active medium 38.

The active region is bounded on one side by a first reflector which, in the embodiment of FIG. 2, is a Distributed Bragg Reflector (DBR) 40 formed by alternating layers of semiconductor or dielectric material with differing refractive indices. The layers 40 are constructed to provide very high reflectivity (in excess of 99%) at the signal wavelength, and low reflectivity at the pump wavelength.

On the other side of the active region 38, is provided a second reflector, which, in the embodiment of FIG. 2, is a mirror 42, with lower reflectivity, though typically also in excess of 99%, to provide the feedback necessary for oscillation at the signal wavelength and typically with high reflectivity at the pump wavelength for increased efficiency. This second reflective surface may be positioned adjacent to the active region 38 or positioned on the optical fibre 18.

Alternatively, the reflectivity of the mirrors 40 and 42 may be selected to establish a single pass pump.

An alternative embodiment positions the second mirror, now 46, within the output optical fibre core, 22, ensuring alignment of the oscillating mode with the optical fibre. In such a case, the resonator 34 becomes a composite, including the optical fibre 18 with Bragg gratings 46, and the layer 42 has low reflectivity at the signal wavelength. The period of the Bragg gratings 46 is preselected to provide for a signal more accurately tuned to a particular wavelength range.

Alternatively, the resonator 34 may be an optically pumped waveguide. laser. For example, a semiconductor waveguide may be fabricated as a DFB laser by impressing a Bragg grating onto the waveguide by known techniques to form the second reflective surface, as exemplified in the embodiment of FIG. 3, which is then coupled to the optical fibre 18.

Depending on the material and construction of the resonator 34, stimulated emission may occur upon exposure of the active region 38 of the resonator 34 to a pump signal 14 in a narrow wavelength range, typical of atomic transitions, or in a broader range of wavelengths, typical of semiconductor materials. The pump signal 14 is absorbed in the appropriate regions of the resonator 34.

The resonator 34 may be included within a connector casing 20 to facilitate coupling to the optical transmission device 10 and to optical fibre 18 for transmission.

Referring to FIGS. 1 and 2, the resonator 34 is coupled to the terminal end 32 of a length of optical fibre 18. The optical fibre 18 typically comprises a core 22 and cladding 24. A buffer 25 and a protective jacket 26 surrounds the optical fibre 18. The optical fibre 18 is adapted to convey an optical signal propagating along its length. The signal from the resonator 34 substantially enters into the terminal end 32 and propagates along the optical fibre 18.

A VCSEL type resonator 34 may be self-aligning with the terminal end 32 of the optical fibre 18. Alternatively, resonators 34 may require manual alignment by conventional alignment methods.

Referring to FIG. 1, the resonator 34 is contained in a wavelength converter module 16. The module 16 is attached to the optical transmission module 10 by a selected connector method, for example, by epoxy for a permanent attachment, or alternatively, a connector casing 20 may be provided with an attachment method adapted to mate with the optical transmission device 10, as more fully described below. Various connector styles may be used for attachment to the optical transmission device 10, for example, ST, FC, RJ, or LC. For example, the module 16 may be in the form of a detachable pigtail, as exemplified in FIGS. 1 and 4.

To assist in positioning the resonator 34 to efficiently couple the wavelength converter module 16 to the optical transmission device 10, the connector end 30 of the connector casing 20 attaches the wavelength converter module 16 to the optical transmission device 10 at an attachment end 50 at a position to maintain the localization of the pump signal 14 from the DM laser 12 to the resonator 34.

A lens 56 may be provided in the optical transmission device 10 and positioned relative to the beam of the pump signal 14 of the DM laser 12 to facilitate localization of the pump signal 14 onto the desired region of the resonator 34, for example, by collimation or focusing.

A ferrule 28 protects and aligns the optical fibre 18 adjacent to the terminal end 32 within the connector casing 20, and may also encompass the terminal end 32.

Hermetic seals may be provided if required. The connector casing 20 may be mated with a corresponding Hermetic seal on the optical transmission device 10. As an example, the lens 56 which relays the pump signal from within the package 10 can form the seal for the optical transmission device 10, while a window (not shown) on the ferrule 28 seals the resonator 34, the attachment end 50 being able to optically couple the pump signal 14 to the resonator 34.

The resulting connection may be permanent or temporary, whereby the wavelength converter module 16 may be detached from the optical transmission device 10.

Figure 4:
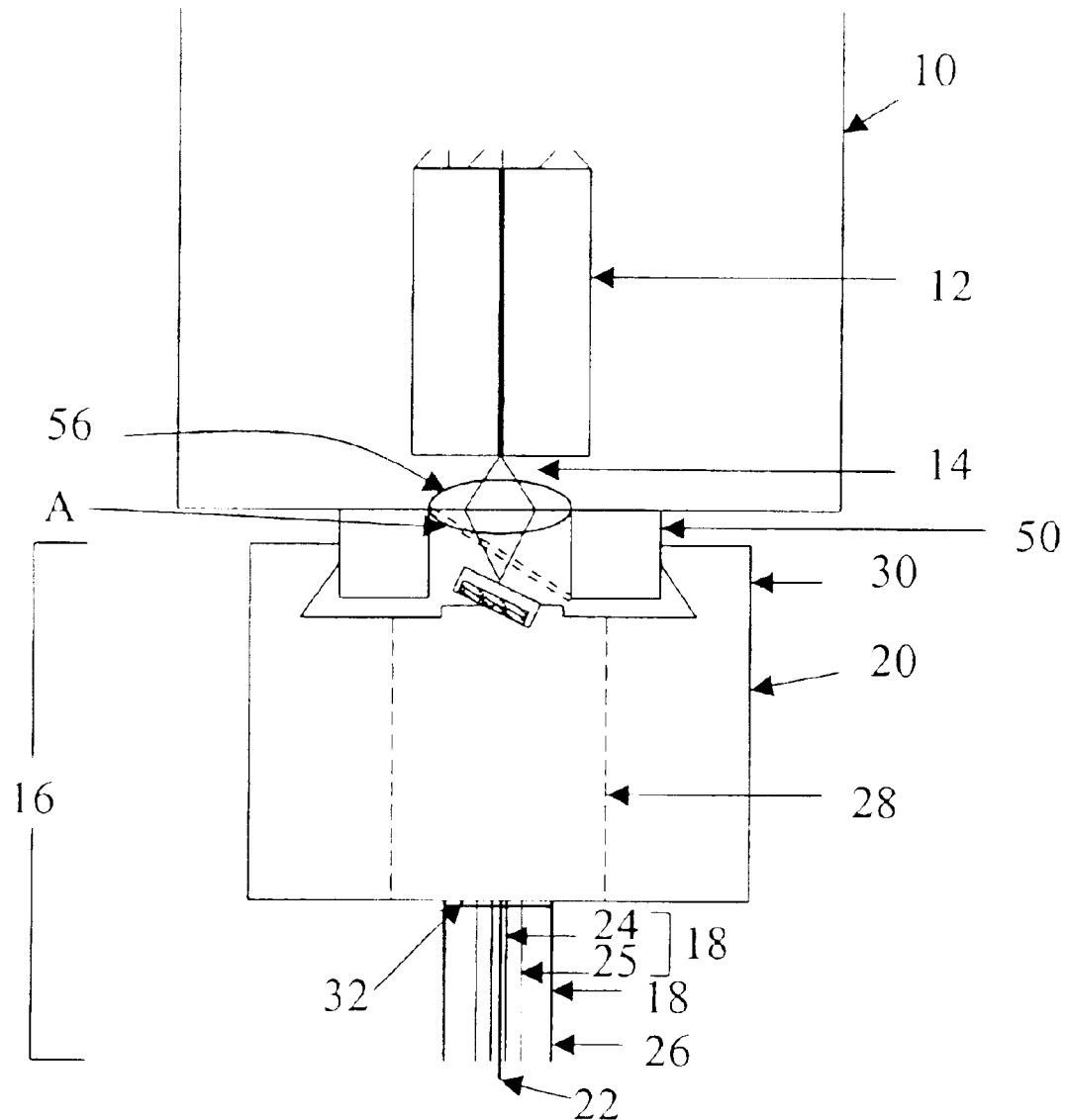
FIG. 4 is a top view of the wavelength converter module, in accordance with another alternative embodiment of the invention.

In the embodiment depicted in FIG. 4, the resonator 34 is angled in relation to the direction of the pump light 14 along axis A so as to reduce reflection of the pump light 14 back into the source 12. An equivalent function can be achieved by angling the pump signal 14 source light through angled DM laser 12 or offset lens 56.

Figure 5:
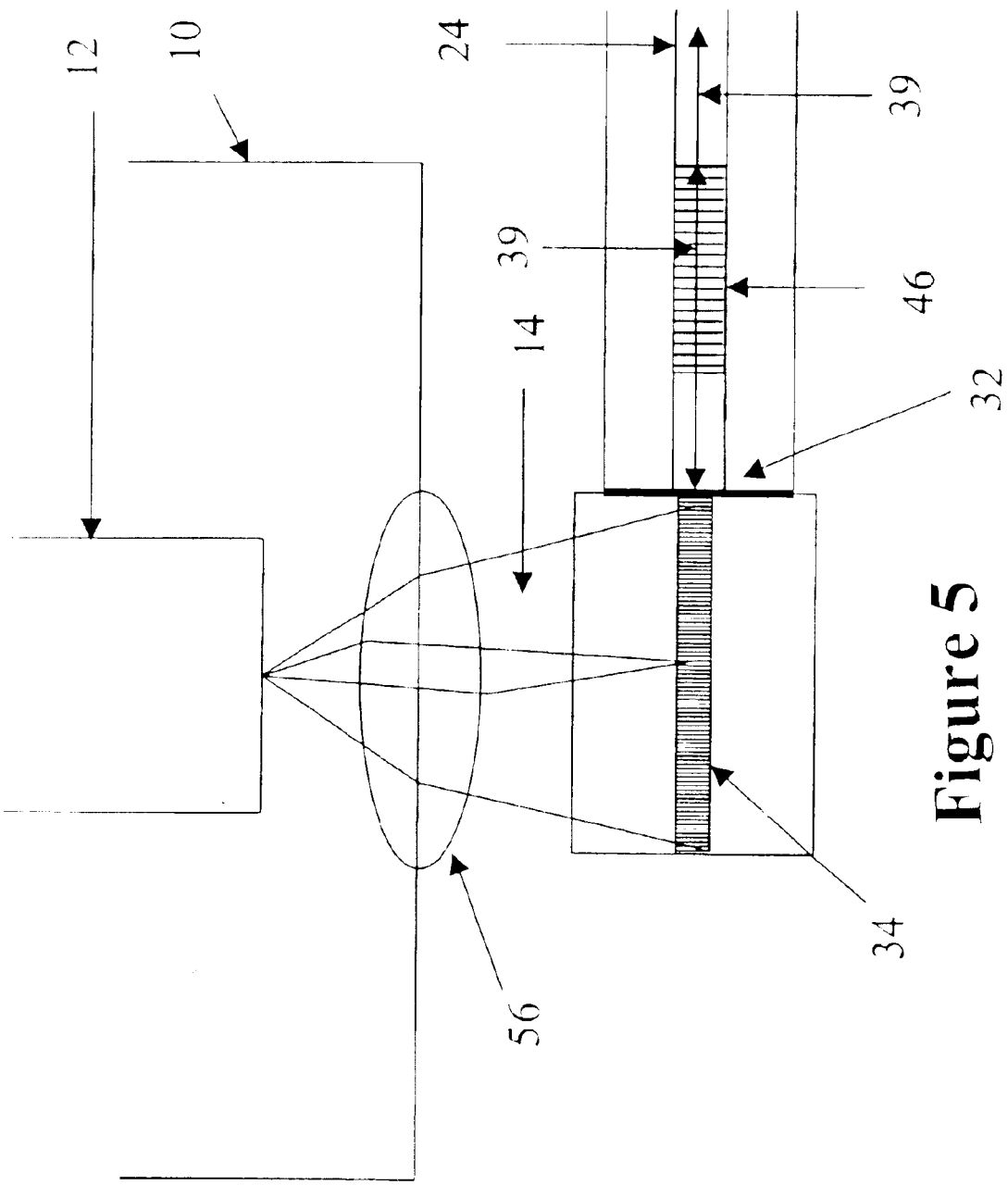
FIG. 5 is a close-up top view of the wavelength converter module with the connector parts removed, in accordance with another alternative embodiment of the invention.

Referring to FIG. 5, the resonator 34 is in a lateral configuration with reference to the DM laser 12. The resonator 34 is an edge-emitting resonator. Pump light 14 from the DM laser 12 is passed through a spherical, cylindrical, dup-cylindrical or elliptical lens 56, depending on the particulars of the geometries of the DM laser 12 and the resonator 34, to optically pump the resonator 34, which emits a signal in a direction substantially perpendicular to the direction of the pump light 14.

In operation, wavelength converter module 16 containing a VCSEL-type resonator 34 produces a signal at a particular wavelength, which is coupled to an optical fibre 18 in the connector casing 20 of a wavelength converter module 16. The connector end 30 of the connector casing 20 is connected to the attachment end 50 of the optical transmission device 10. The DM laser 12, associated with the optical transmission device 10, provides the pump signal 14 containing a modulated data stream.

The resonator 34 passively absorbs the pump signal 14 of a particular wavelength, which also serves to optically pump the atoms in the active region 38 of the resonator 34 from a lower to a higher energy state whereby a population inversion is created. The feedback mechanism of the resonator 34 comprising the highly reflective mirror 40 on one side of the active region and a less reflective mirror 42, or 46, on the other side, returns a portion of the coherent light originally produced in the active medium of the active region 38 back to the active medium for further amplification by stimulated emission. On stimulated emission, a signal modulated in a like manner to that of the pump signal is emitted through the second mirror 42 in a wavelength range for which it was configured, independent of the wavelength of the pump signal 14, and enters into the terminal end 18 to which the resonator 34 is coupled, to propagate along the optical fibre 18.

Preferably, the minimum output power for the directly modulated laser 12 is the threshold condition for the resonator 34, and the resonator 34 should be designed to respond appropriately to the speed of the data signal, 14.

Examples of signal wavelength regions in an optical communications system are 850, 1275 to 1320 or 1520 to 1620 nanometers, although other wavelengths are used as well, but the wavelengths may be used as the specifics of the gain material are changed. Within each range there will be specific wavelengths of use (for example the ITU frequency grid for DWDM communications). Wavelength converter module 16 may be detached and removed from the optical transmission device 10 so that an alternative wavelength converter with a different signal wavelength may be substituted.

For example, a gigabit ethernet module is an optical transmission device 10, which could provide a pump signal 14 and data stream at about 850 nanometers, primarily modulated in terms of intensity, and may be connected to a wavelength converter module 16 including a resonator 34 configured to emit an optical signal at around 1300 nanometers for some applications, or around 1550 nm in order to produce a signal that may be used in an amplified system or a WDM system. Alternatively, the gigabit ethernet module may provide pump signal 14 and data stream at around 1300 nanometers and connected to a wavelength converter module 16, where the resonator 34 is configured to emit a signal at around 1550 nanometers. While the output from the stock gigabit ethernet module is too low for many applications, more power can be made available.

The invention may be used in additional, related, forms. For example, it may at times be advantageous to have the wavelength conversion take place at a distance from the signal source. Under these conditions it is only necessary that the loss of the signal from the source to the converter and the propagation fidelity are appropriate for the task.

The present invention has been described with regard to preferred embodiments. However, it will be obvious to persons skilled in the art that numerous modifications, variations, and adaptations may be made to the particular embodiments of the invention described above without departing from the scope of the invention, which is defined in the claims.

What is claimed is:

1. A method of optical wavelength conversion comprising the steps of:
    (a) attaching a module to a source; the module having a receiving end and a transmitting end;
    (b) receiving a modulated optical signal of a first wavelength from the source in the module,
    (c) stimulating an active medium in a resonator in the module; the resonator having two reflectors surrounding the active medium; using the modulated optical signal of the first wavelength for optically generating a like modulated optical signal of a second wavelength without electrical injection and entirely within an optical domain; the modulated optical signal of the first wavelength entering the module through the receiving end; and (c) transmitting the modulated optical signal of the second wavelength through the transmitting end of the module.

2. A method of claim 1 further including the step of generating the signal of step (a).

3. A method of claim 1 wherein the signal of step (c) is transmitted along the same directional course as the signal of step (a).

4. A method of claim 1 wherein the signal of step (c) is transmitted along a different directional course than the signal of step (a).

5. A method of claim 4 wherein the signal of step (c) is transmitted in a direction substantially perpendicular to the signal of step (a).

6. An optical wavelength converter module for converting a wavelength from a source, the module comprising:

(a) a receiving end for receiving a modulated optical signal of a first wavelength from the source;

(b) a connector for detachably coupling the module to the source;

(c) a resonator having two reflectors and an active medium therebetween, the active medium being responsive to the modulated optical signal of the first wavelength for optically generating a like modulated optical signal of a second wavelength; said resonator operating entirely within optical domain and without electrical injection; and (d) a transmitting end for transmitting the modulated optical signal of the second wavelength.

7. An optical wavelength converter of claim 6 wherein the resonator is a semiconductor VCSEL type.

8. An optical wavelength converter of claim 6 wherein the resonator is a semiconductor edge emitter.

9. An optical wavelength converter of claim 6 wherein the resonator is an optically pumped waveguide with gain.

10. An optical wavelength converter of claim 6 wherein the resonator is provided with means for compensating for temperature variations.

11. An optical wavelength converter of claim 10 wherein the means for compensating comprises cladding the resonator in silicone.

12. An optical wavelength converter of claim 6 wherein the signal transmitted at the transmitting end is along a same directional course as the signal received at the receiving end.

13. An optical wavelength converter of claim 6 wherein the signal transmitted at the transmitting end is along a different directional course than the signal received at the receiving end.

14. An optical wavelength converter of claim 13 wherein the directional course is selected to reduce back reflection of the signal received at the receiving end.

15. An optical wavelength converter of claim 13 wherein the differential directional course is a perpendicular course.

16. An optical wavelength converter of claim 6 wherein the active medium is responsive to data signal speeds.

17. An optical wavelength converter of claim 6 wherein the optical signal received at the receiving end is of a power that is the threshold condition for the resonator.

18. An optical wavelength converter of claim 6 wherein the optical signal transmitted at the transmitting end has a wavelength signal region suitable for optical communications.

19. An optical wavelength converter of claim 18 wherein the optical signal transmitted at the transmitting end has a wavelength signal region suitable for optical communications.

20. An optical wavelength converter of claim 6 wherein the optical signal is suitable for a WDM system.

* * * * *